(12) United States Patent
Lv et al.

(10) Patent No.: US 12,002,500 B2
(45) Date of Patent: Jun. 4, 2024

(54) WRITING METHOD AND ERASING METHOD OF FUSION MEMORY

(71) Applicant: INSTITUTE OF MICROELECTRONICS, CHINESE ACADEMY OF SCIENCES, Beijing (CN)

(72) Inventors: Hangbing Lv, Beijing (CN); Qing Luo, Beijing (CN); Xiaoxin Xu, Beijing (CN); Tiancheng Gong, Beijing (CN); Ming Liu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 282 days.

(21) Appl. No.: 17/426,053

(22) PCT Filed: Jan. 28, 2019

(86) PCT No.: PCT/CN2019/073435
§ 371 (c)(1),
(2) Date: Jul. 27, 2021

(87) PCT Pub. No.: WO2020/154844
PCT Pub. Date: Aug. 6, 2020

(65) Prior Publication Data
US 2022/0115052 A1    Apr. 14, 2022

(51) Int. Cl.
*G11C 11/22* (2006.01)
*G11C 16/14* (2006.01)
*G11C 16/34* (2006.01)

(52) U.S. Cl.
CPC ...... *G11C 11/2273* (2013.01); *G11C 11/2275* (2013.01); *G11C 11/2297* (2013.01); *G11C 16/14* (2013.01); *G11C 16/3404* (2013.01)

(58) Field of Classification Search
CPC .................................................... G11C 11/223
See application file for complete search history.

(56) References Cited

U.S. PATENT DOCUMENTS

| | | | |
|---|---|---|---|
| 6,067,244 A * | 5/2000 | Ma | G11C 11/22 365/222 |
| 7,973,348 B1 * | 7/2011 | Dalton | H01L 29/78391 257/295 |

(Continued)

FOREIGN PATENT DOCUMENTS

| CN | 1815741 A | 8/2006 |
|---|---|---|
| CN | 103165172 A | 6/2013 |

(Continued)

*Primary Examiner* — Douglas King
(74) *Attorney, Agent, or Firm* — Christensen, Fonder, Dardi & Herbert PLLC

(57) ABSTRACT

A writing method and erasing method of a fusion memory are provided, and the fusion memory includes a plurality of memory cells, and each memory cell of the plurality of memory cells includes a bulk substrate; a source and a drain on the bulk substrate, a channel region extending between the source and the drain, and a ferroelectric layer and a gate stacked on the channel region; and the writing method includes: applying a first voltage between the gate of at least one memory cell and the bulk of at least one memory cell, in which the first voltage is less than a reversal voltage at which the ferroelectric layer is polarization reversed, and each of the source and the drain is grounded or in a floating state.

15 Claims, 11 Drawing Sheets

(56) References Cited

U.S. PATENT DOCUMENTS

| | | | |
|---|---|---|---|
| 11,282,559 B1* | 3/2022 | Tanaka | G11C 11/2275 |
| 2005/0054166 A1 | 3/2005 | Hsu et al. | |
| 2009/0261395 A1* | 10/2009 | Boescke | H01L 21/02194 |
| | | | 257/295 |
| 2014/0355328 A1* | 12/2014 | Muller | G11C 11/2275 |
| | | | 257/295 |
| 2017/0076775 A1* | 3/2017 | Müller | G11C 11/221 |
| 2017/0162250 A1* | 6/2017 | Slesazeck | G11C 11/2273 |
| 2018/0322912 A1* | 11/2018 | Duenkel | G11C 16/0466 |
| 2019/0019802 A1* | 1/2019 | Yoo | H01L 29/517 |
| 2023/0054290 A1* | 2/2023 | Yoo | H01L 29/78391 |

FOREIGN PATENT DOCUMENTS

| | | |
|---|---|---|
| CN | 106537509 A | 3/2017 |
| CN | 108701655 A | 10/2018 |

* cited by examiner

WRITING METHOD AND ERASING METHOD OF FUSION MEMORY

CROSS-REFERENCE TO RELATED APPLICATION

The present disclosure is a Section 371 National Stage Application of International Application No. PCT/CN2019/073435, filed on Jan. 28, 2019, entitled "WRITING METHOD AND ERASING METHOD OF FUSION MEMORY".

TECHNICAL FIELD

The present disclosure relates to a field of memory, and in particular to a writing method and erasing method of a fusion memory.

BACKGROUND

A conventional DRAM (Dynamic Random Access Memory) includes a memory cell structure of 1T1C (1 Transistor-1 Capacitor). When a word line connected to a gate of a transistor is gated, the transistor is turned on, and bit information stored on a capacitor may be read from a bit line. A conventional NAND includes a floating gate structure or a charge trap structure. The DRAM is used to realize dynamic random storage, and the NAND is used to realize non-volatile storage. A process for manufacturing the DRAM is very different form a process for manufacturing the NAND, and the DRAM and the NAND cannot be integrated in a same system on chip (SOC) at the same time. Therefore, advantages of the two types of memories may not be combined, which limits storage capacity and computing capability of the SOC.

In neural networks, a conventional synaptic device is implemented by simulations of a two-terminal memristor or a three-terminal transistor. The synaptic device is generally connected to each other by using a parallel NOR structure. After weight training, current convergence is used to complete a calculation. The type of structure has problems such as large operating current and high training power consumption, which limits the number of parallels.

SUMMARY

According to an aspect of the present disclosure, a writing method of a fusion memory is provided, and the fusion memory includes a plurality of memory cells, and each of the plurality of memory cells includes a bulk substrate, a source and a drain on the bulk substrate; a source and a drain on the bulk substrate, a channel region extending between the source and the drain, and a ferroelectric layer and a gate stacked on the channel region; and the writing method includes:

applying a first voltage between the gate of at least one memory cell and the bulk of at least one memory cell, in which the first voltage is less than a reversal voltage at which the ferroelectric layer is polarization reversed, and each of the source and the drain is grounded or in a floating state.

In a further embodiment, the writing method further includes: applying a second voltage between the gate of at least one memory cell and the bulk of at least one memory cell, in which the second voltage is greater than a reversal voltage at which the ferroelectric layer is polarization reversed; and the source is in a grounded state, the gate is in a positive voltage state.

In a further embodiment, the first voltage is positive, and the first voltage is between 0.5 V and 3 V.

In a further embodiment, the second voltage is positive, and the second voltage is between 3 V and 10 V.

In a further embodiment, the applying a first voltage includes applying a forward first voltage to the gate so that a voltage of the bulk is in a grounded state.

In a further embodiment, the applying a second voltage includes applying a forward second voltage to the gate so that a voltage of the bulk is in a grounded state.

In a further embodiment, the writing method further includes: adjusting a threshold voltage of a corresponding memory cell by adjusting the first voltage and/or by changing a lattice defect of the ferroelectric layer.

In a further embodiment, the writing method further includes: adjusting a threshold voltage of a corresponding memory cell by adjusting the second voltage and/or reversing the polarization.

In a further embodiment, the writing method further includes: applying a read voltage, wherein the read voltage is an intermediate value of a threshold voltage adjustment interval.

According to another aspect of the present disclosure, an erasing method of a fusion memory is provided, and the fusion memory includes a plurality of memory cells, each memory cell of the plurality of memory cells includes a bulk substrate; a source and a drain on the bulk substrate, a channel region extending between the source and the drain, and a ferroelectric layer and a gate stacked on the channel region; and the erasing method includes:

applying a third voltage between the gate of at least one memory cell and the bulk of at least one memory cell, and an absolute value of the third voltage is less than a reversal voltage at which the ferroelectric layer is polarization reversed, and each of the source and the gate is grounded or in a floating state.

In a further embodiment, the erasing method further includes: applying a fourth voltage between the gate of at least one memory cell and the bulk of at least one memory cell, and an absolute value of the fourth voltage is greater than a reversal voltage at which the ferroelectric layer is polarization reversed; and each of the source and the gate is in grounded or in the floating state.

In a further embodiment, the third voltage is negative, and the third voltage is between −1 V and −3 V.

In a further embodiment, the fourth voltage is positive, and the fourth voltage is between −3 V and −10 V.

In a further embodiment, the applying a third voltage includes applying a reverse voltage to the gate so that a voltage of the bulk is in a grounded state.

In a further embodiment, the applying a fourth voltage includes applying a reverse voltage to the gate so that a voltage of the bulk is in a grounded state.

According to another aspect of the present disclosure, there is also provided a processing method of a fusion memory, including the above-mentioned writing method and erasing method, and/or the above-mentioned reading method.

DETAILED DESCRIPTION OF EMBODIMENTS

Figure 1:
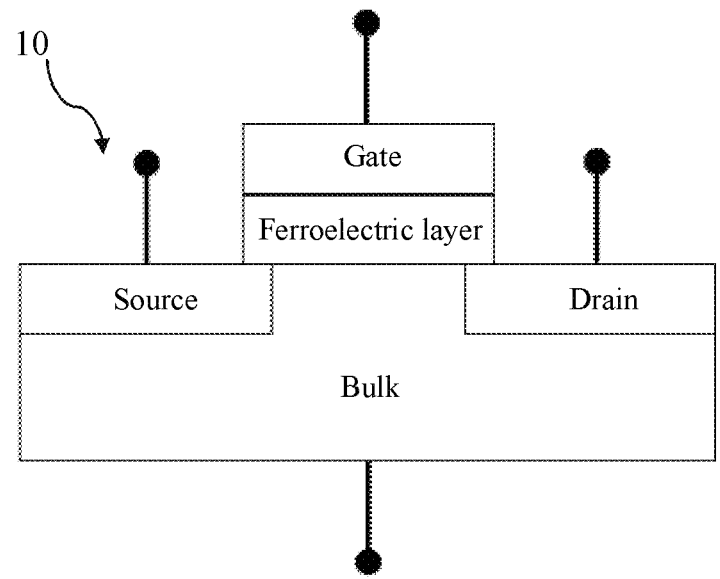
FIG. 1 shows a cross-sectional schematic diagram of a memory cell in a fusion memory according to the embodiments of the present disclosure.

In order to make the purpose, technical solutions, and advantages of the present disclosure clearer, the present disclosure will be further described in detail below in conjunction with specific embodiments and with reference to the accompanying drawings. Hereinafter, some embodiments will be provided to describe the embodiments of the present disclosure in detail. The advantages and effects of the present disclosure will be more prominent through the following content of the present disclosure. The accompanying drawings in this specification are simplified and used as examples. The number, shape, and dimension of the components shown in the drawings can be modified according to actual conditions, and the configuration of the components may be more complicated. Other aspects of practice or application can also be carried out in the present disclosure, and various changes and adjustments can be made without departing from the spirit and scope defined in the present disclosure.

The terms "on", "over", "under" and other terms in the present disclosure, unless otherwise specified, mean that a semiconductor layer structure in a memory is directly on another semiconductor layer structure or directly under another semiconductor layer structure. That is, when "on" or "under" is used to describe two semiconductor layers are in direct contact, for example, "a ferroelectric layer on the channel region" means that the ferroelectric layer is directly on the channel region. The "bulk" in the present disclosure refers to a substrate or a well material that may form one or more memory cells.

According to an aspect of the embodiments of the present disclosure, a fusion memory is provided, and the fusion memory includes a plurality of memory cells, and each memory cell of the plurality of memory cells includes a ferroelectric layer, so that the memory cell may operate in a charge trap mode and a polarization reversal mode. The fusion memory combines the functions of DRAM and NAND, thereby combining the advantages of DRAM and NAND.

FIG. 1 shows a cross-sectional schematic diagram of a memory cell in a fusion memory according to the embodiments of the present disclosure. FIG. 1 shows a fusion memory, and the fusion memory includes a plurality of memory cells 10, and each memory cell 10 of the plurality of memory cells 10 includes: a bulk substrate; a source and a drain on the bulk substrate; a channel extending between the source and the drain; a ferroelectric layer on the channel; and a gate on the ferroelectric layer.

The memory cell in this embodiment includes the channel region and the ferroelectric layer thereon, the channel region and the ferroelectric layer are in direct contact. By adjusting a voltage applied to the gate, the ferroelectric layer may operate in a charge trap mode and a polarization reversal mode.

The ferroelectric layer between the gate and the channel shown in FIG. 1 is used as a gate dielectric. The fusion memory may operate in two modes: on the one hand, a large number of lattice defects in a ferroelectric material are used for charge storage, so that the fusion memory may operate in the charge trap mode, and store data by trapping and releasing charges; on the other hand, the fusion memory may also operate in the ferroelectric reversal mode, and store data through polarization reversion.

In some embodiments, the ferroelectric layer may include a material that is doped $HfO_x$, $ZrO_x$, PZT, BFO or BST, preferably $HfO_x$; doping elements may be Si, Zr, Hf, Al, Y, Gd, La, Sr, Ti, and/or N, etc., preferably Zr; and doping content is between 10% and 75%.

In some embodiments, a thickness of the ferroelectric layer is 3 nm to 10 nm. A length of the channel is 5 nm to 200 nm, and a width of the channel is 5 nm to 500 nm.

In some embodiments, the above-mentioned bulk, source, drain, and gate may be configured according to the existing memory cells arrangement, and a corresponding manufacturing process may also be performed with reference to the existing process flow.

In some embodiments, the fusion memory further includes a control circuit, and a gate control sub-circuit connected to each memory cell. The gate control sub-circuit is used to separately apply a specific first voltage to the gate, so that the ferroelectric layer under the gate traps electrons and changes a threshold voltage during charging or discharging. The control circuit may also be integrated in a read-write circuit of the fusion memory to control a corresponding voltage pulse value during a read-write process. The read-write circuit writes content into an accessed memory cell at the first voltage or reads information from the accessed memory cell according to read and write instructions of CPU. An absolute value of the first voltage may be less than a reversal voltage required for the polarization reversal of a ferroelectric material in the ferroelectric layer.

As the first voltage increases, the more electrons trapped by the ferroelectric layer, the threshold voltage of the memory cell will gradually increase.

In some embodiments, the control circuit is also used to separately apply a specific second voltage to the gate, so that charges of the gate realize the polarization reversal, and a threshold voltage is changed accordingly. The threshold voltage gradually decreases with the increase of the second voltage. The read-write circuit writes content into an accessed memory cell at the second voltage or reads information from the accessed memory cell according to read and write instructions of CPU. An absolute value of the second voltage may be greater than a reversal voltage value required for the polarization reversal of a ferroelectric material in the ferroelectric layer.

In some embodiments, according to requirements of the memory, the source and the drain may be kept in a floating state, or adjusted to a corresponding state (a positive voltage, a negative voltage or ground) according to an operating state (writing, erasing, or reading) of the memory. A specific adjustment manner may refer to the following embodiments of a writing method of the fusion memory.

In some embodiments, in a specific program, the above-mentioned control circuit may control a voltage applied to the gate to be the first voltage or the second voltage, that is, a charge trap mode and a polarization reversal mode may exist be in a process at the same time, which may play the respective advantages of DRAM and conventional flash.

In some embodiments, the fusion memory of the embodiments of the present disclosure may provide a word line, bit line, and source line known in the related art to configure a memory cell array. The word line is coupled to the gate of the corresponding memory cell, the bit line is coupled to the drain of the corresponding memory cell, and the source line is coupled to the source of the corresponding memory cell.

In some embodiments, the fusion memory of the embodiments of the present disclosure further includes a readout circuit for reading information stored in each memory cell. The readout circuit may read information stored in each memory cell by applying a smaller readout voltage (for example, 0.6 V) in the polarization reversal mode and the ferroelectric layer charge trap mode, respectively.

Figure 2:
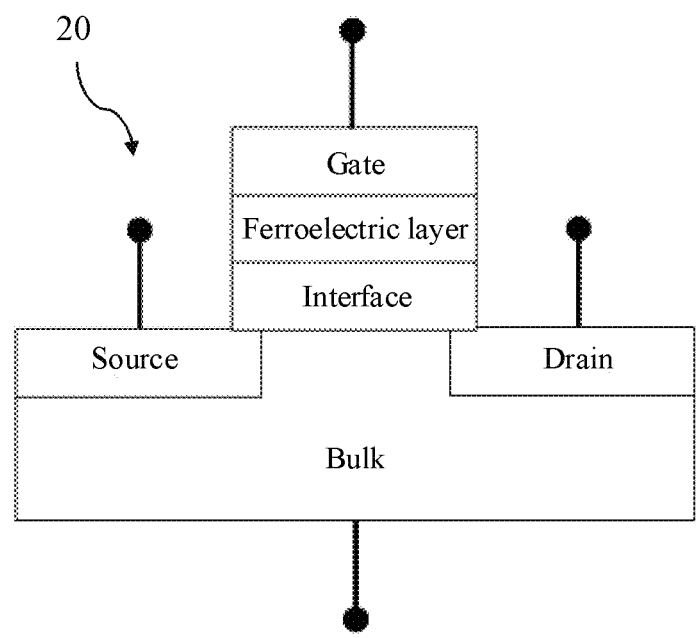
FIG. 2 shows a cross-sectional schematic diagram of a memory cell in another fusion memory according to the embodiments of the present disclosure.

FIG. 2 shows a cross-sectional schematic diagram of a memory cell in another fusion memory according to the embodiments of the present disclosure. FIG. 2 provides a fusion memory, and the fusion memory includes a plurality of memory cells 20, and each memory cell 20 of the plurality of memory cells 20 includes: a bulk substrate; a source and a drain on the bulk substrate; a channel extending between the source and the drain; a first interface layer on the channel region;
a ferroelectric layer on the first interface layer; and a gate on the ferroelectric layer.

A structure of the memory cell in this embodiment is substantially similar to that in FIG. 1, except that a first interface layer is provided between the ferroelectric layer and the channel. The first interface layer may be used to control a growth of a ferroelectric material, such as lattice orientation control or defect distribution.

In some embodiments, the first interface layer may include a material that is $SiO_2$, SiN, SiON, $AlO_x$, $TiO_2$ or $HfO_x$, preferably $SiO_2$. A thickness of the first interface layer may be 0.3 nm to 3 nm. The material of the first interface layer is adjusted according to a material of the ferroelectric layer to be grown. For example, when the material of the ferroelectric layer is $HfO_x$, a corresponding material of the first interface layer may be SiON. For example, when the material of the ferroelectric layer is SBT, a corresponding material of the first interface layer may be $HfO_x$ or $AlO_x$.

Figure 3:
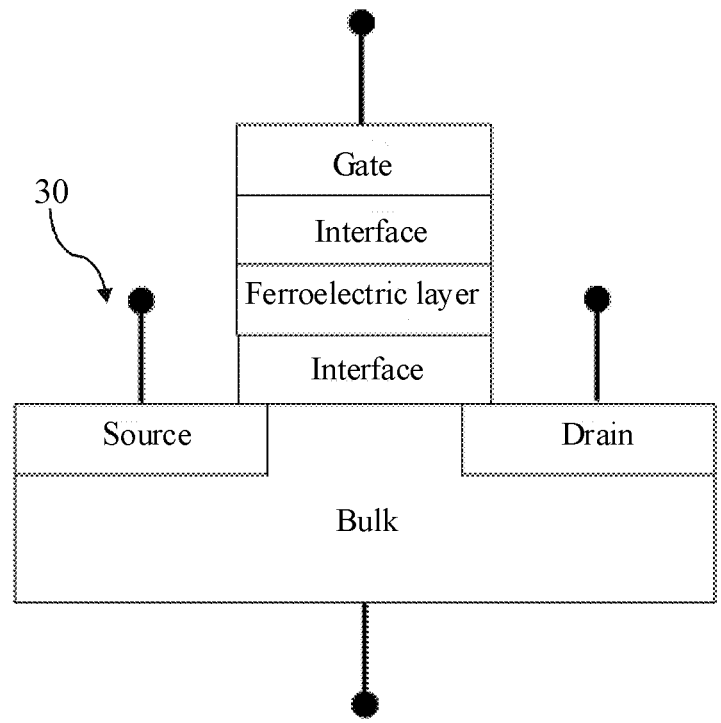
FIG. 3 shows a cross-sectional schematic diagram of a memory cell in yet another fusion memory according to the embodiments of the present disclosure.

FIG. 3 shows a cross-sectional schematic diagram of a memory cell in another fusion memory according to the embodiments of the present disclosure. FIG. 3 provides a fusion memory, and the fusion memory includes a plurality of memory cells 30, and each memory cell 30 of the plurality of memory cells 30 includes: a bulk substrate; a source and a drain on the bulk substrate; a channel extending between the source and the drain; a first interface layer on the channel; a ferroelectric layer on the first interface layer; a second interface layer on the ferroelectric layer; and a gate on the second interface layer.

A structure of the memory cell in this embodiment is substantially similar to that in FIG. 1, except that a first interface layer is provided between the ferroelectric layer and the channel, and a second interface layer is provided between the ferroelectric layer and the gate. The first interface layer may be used to control a growth of a ferroelectric material, such as lattice orientation control or defect distribution. The second interface layer is used to isolate the metal gate and a storage layer to avoid mutual diffusion and interface damage.

In some embodiments, the first interface layer may include a material that is $SiO_2$, SiN, SiON, $AlO_x$, $TiO_2$, $HfO_x$ or a combination thereof, preferably $SiO_2$. A thickness of the first interface layer may be 0.3 nm to 3 nm. The material of the first interface layer is adjusted according to a material of the ferroelectric layer to be grown. For example, when the material of the ferroelectric layer is $HfO_x$, a corresponding material of the first interface layer may be SiON. For example, when the material of the ferroelectric layer is SBT or PZT, a corresponding material of the second interface layer may be $HfO_x$ or $AlO_x$.

In some embodiments, the second interface layer may include a material that is $SiO_2$, SiN, SiON, $AlO_x$, $TiO_2$ or $HfO_x$, preferably $AlO_x$. A thickness of the second interface layer may be 1 nm to 10 nm. The material of the second interface layer is adjusted according to a material of the ferroelectric layer and a material of the gate. For example, when the material of the ferroelectric layer is $HfO_x$, a corresponding material of the second interface layer material may be a stack of $SiO_2/SiN/SiO_2$. For example, when the material of the ferroelectric layer is SBT or PZT, a corresponding material of the second interface layer may be $HfO_x$ or $AlO_x$.

Figure 4:
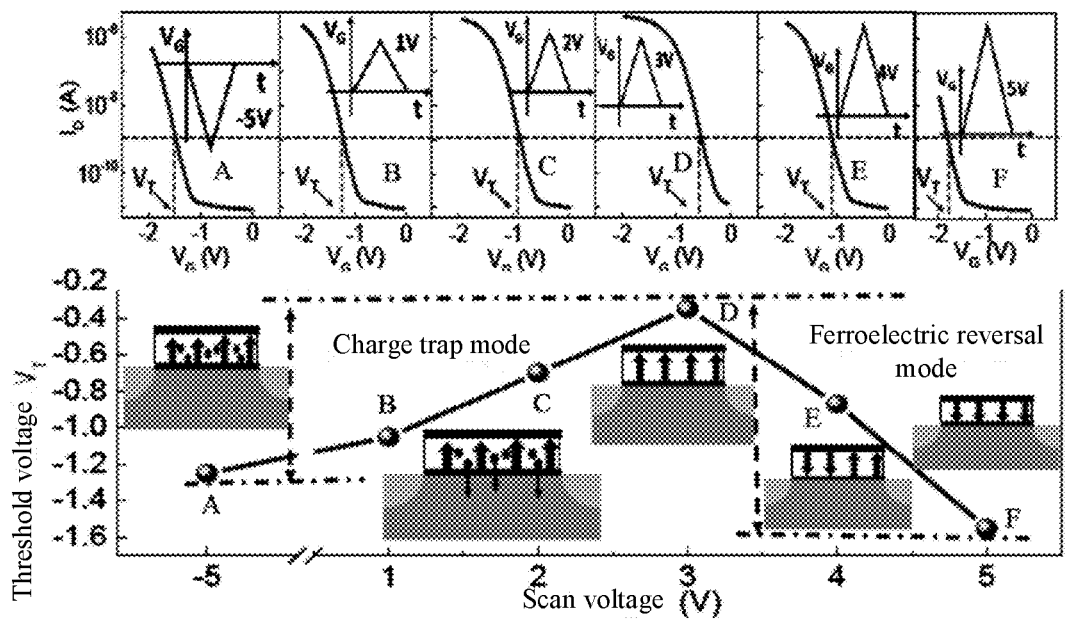
FIG. 4 shows a schematic diagram of the principle of a fusion memory according to the embodiments of the present disclosure.

An operating principle of the memory cell in the fusion memory of the above-mentioned embodiments may be referred to as shown in FIG. 4.

FIG. 4 shows a schematic diagram of the principle of a fusion memory according to the embodiments of the present disclosure. As shown in FIG. 4, in a charge trap mode, when a gate voltage $V_G$ gradually increases, a threshold voltage $V_T$ also gradually increases. At point A, a scan voltage is −5 V, and a corresponding threshold voltage $V_T$ is about −1.5 V, when the scan voltage gradually increases and changes to a positive value, such as at point B, the scan voltage is 1 V, and the threshold voltage $V_T$ is about −1.1 V, compared with the threshold voltage at the point A, the threshold voltage at the point B is increased, the case is similar to a case at point C and point D, and the fusion memory is also in the charge trap mode. When the scan voltage increases to 4 V, the scan voltage exceeds a reversal voltage at which the ferroelectric layer is polarization reversed. At this time, the ferroelectric layer is polarization reversed and the threshold voltage drops. When the scan voltage is continuously increased, the threshold voltage $V_T$ gradually decreases, and the fusion memory is in the ferroelectric layer polarization reversal mode at this time.

According to another aspect of the embodiments of the present disclosure, a writing method of a fusion memory is further provided. The fusion memory includes a plurality of memory cells, and each memory cell of the plurality of memory cells includes: a bulk substrate; a source and a drain on the bulk substrate; a channel extending between the source and the drain; and a ferroelectric layer and a gate stacked on the channel. It should be noted that, there may not be any semiconductor layer provided between the channel and the ferroelectric layer; alternatively, the above-mentioned first interface layer may be provided between the channel and the ferroelectric layer; alternatively, the first interface layer and the second interface layer may be provided between the ferroelectric layer and the channel. Therefore, the memory cell here may be the memory cell described in any of the embodiments in FIGS. 1 to 3. The writing method of the fusion memory in the embodiments includes the following steps.

A first voltage is applied between the gate and the bulk substrate of at least one memory cell, and the first voltage is less than a reversal voltage at which the ferroelectric layer is polarization reversed; and each of the source and the gate is grounded or in a floating state.

Figure 5:
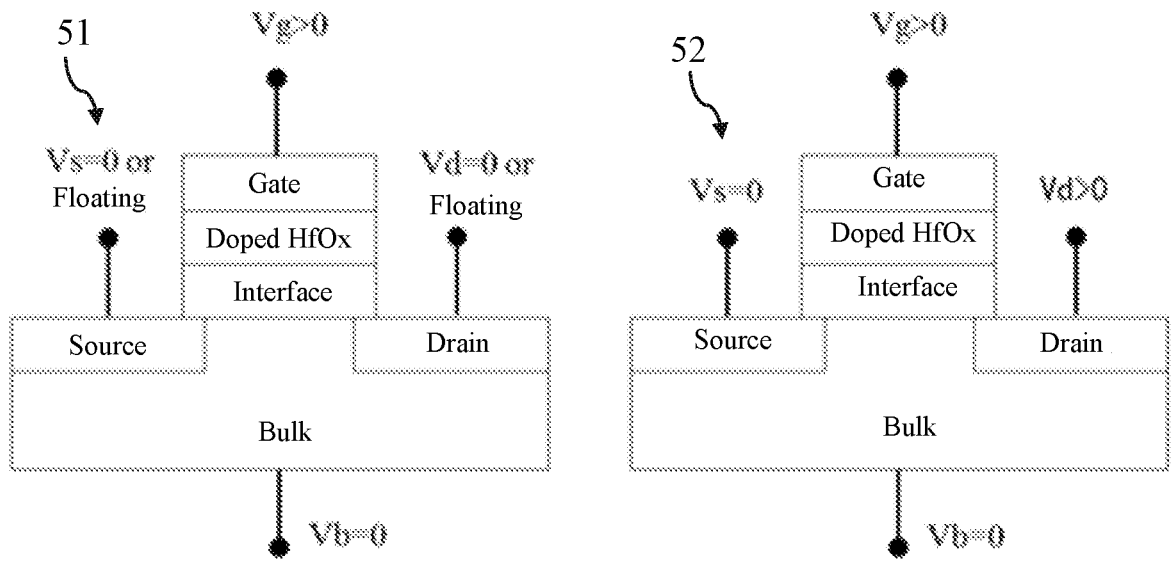
FIG. 5 shows a schematic diagram of a writing method of a fusion memory according to the embodiments of the present disclosure.

FIG. 5 shows a schematic diagram of a writing method of a fusion memory according to the embodiments of the present disclosure. As shown by 51 in FIG. 5, each of the source of the memory cell and the drain of the memory cell is maintained at zero potential (such as grounded) or in a floating state, and the bulk substrate is maintained at zero potential (such as grounded). In addition, a first voltage is applied to the gate, the first voltage is less than a reversal voltage at which the ferroelectric layer is polarization reversed. The operating state may refer to the charge trap mode in FIG. 4, which is implemented in a low voltage range (less than the reversal voltage). By applying the first voltage, the electrons are charged and discharged, and the threshold voltage is changed. The changing process of the threshold voltage is faster, and may reach a programming speed of 20 ns, which is faster and has a lower voltage than the conventional DRAM.

Figure 7A:
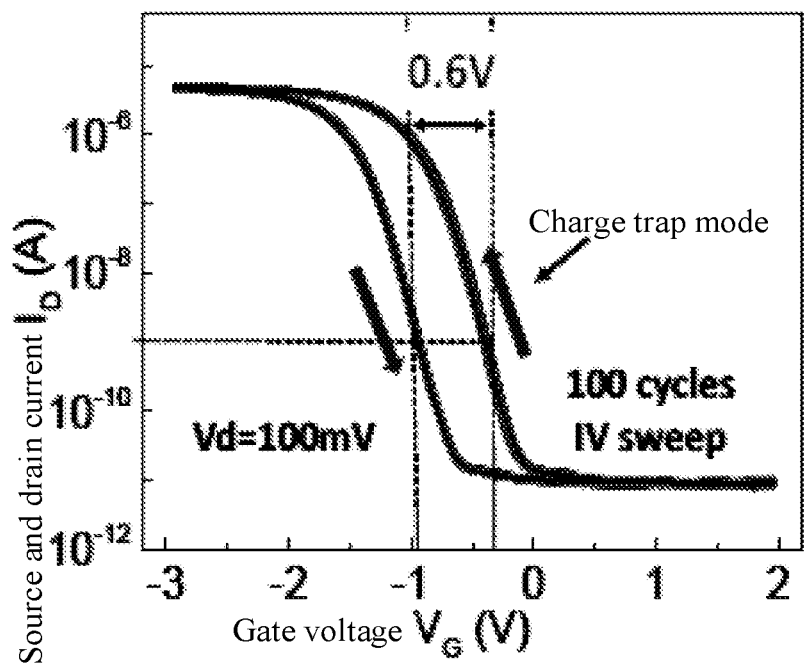
FIGS. 7A, 7B, and 7C are respectively a voltage scan curve diagram, a schematic diagram of writing and erasing, and a schematic diagram of reading of a fusion memory in a charge trap mode according to the embodiments of the present disclosure.
Figure 7B:
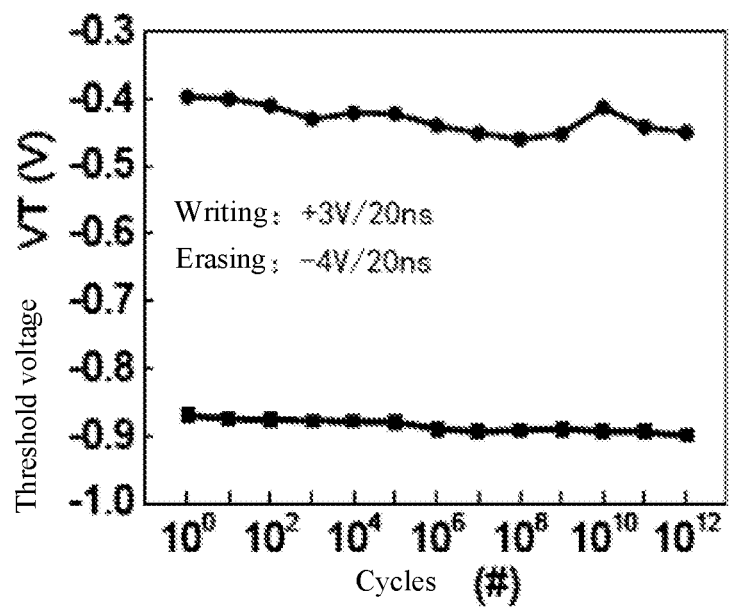
Figure 7C:
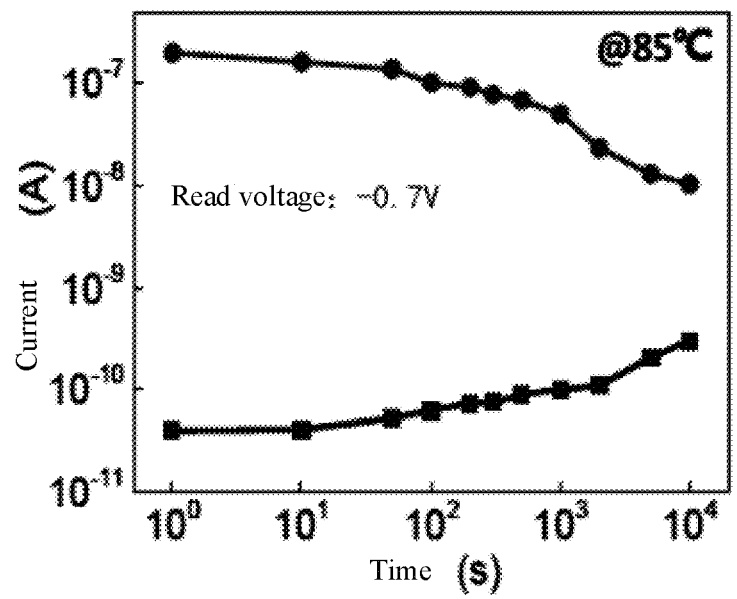

Referring to FIGS. 7A to 7C at the same time, as shown in FIG. 7A, when an electric field is applied to the memory cell (that is, a transistor containing a ferroelectric layer), a central atom in the crystal of the ferroelectric layer stays in a low energy state in a direction the electric field. After removing the electric field, the central atom remains in a low energy state. When a first voltage is applied, the ferroelectric domain is not polarization reversed (the first voltage is in a non-reversed voltage range). As shown in FIG. 7B, a forward first voltage is set to 3 V and a pulse time is set to 20 ns. During this process, the threshold voltage is changed, that is, data writing is realized. By comparing with the existing DRAM, as shown in FIG. 7B and FIG. 7C, after the number of cycles is more than $10^{12}$, the threshold voltage is still less than that of the conventional DRAM, and a retention time is more than 1000 seconds at 85° C., and a speed is equivalent to that of DRAM, and retention characteristics are much better than the DRAM in the related art.

In some embodiments, the writing method of the fusion memory may further include a writing manner 52 as shown in FIG. 5. In the writing manner, a second voltage is applied between the gate of at least one memory cell and the bulk substrate of at least one memory cell, and the second voltage is greater than the reversal voltage at which the ferroelectric layer is polarization reversed, and the source is in a grounded state, and the gate is in a positive voltage state. The operating state may refer to the ferroelectric layer polarization reversal mode in FIG. 4, which is implemented in a high voltage range (which is greater than the reversal voltage). By applying the second voltage, the ferroelectric domain is polarization reversed. A programming voltage of this process is still less than that of conventional FLASH, and the programming speed is also faster, and may reach a programming speed of 20 ns.

Figure 8A:
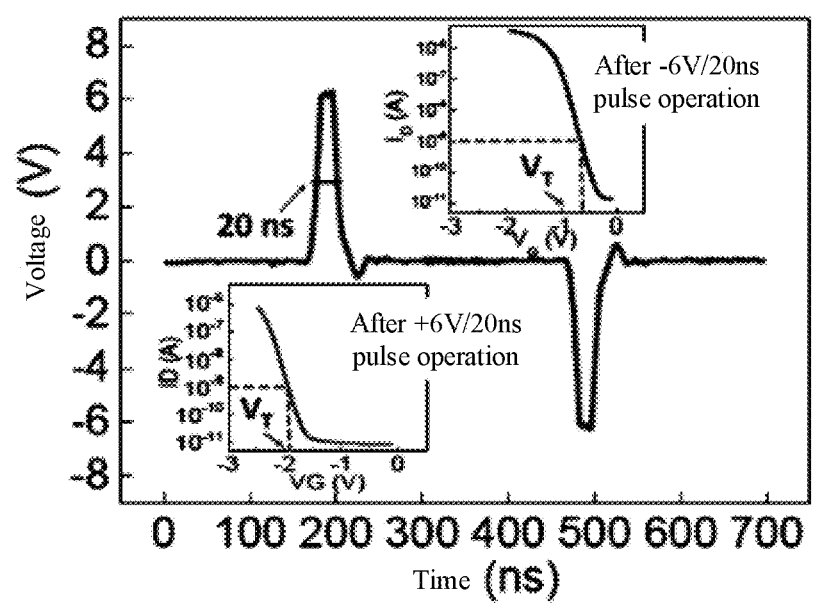
FIGS. 8A, 8B, and 8C are respectively schematic diagrams of single-cycle operation, multi-cycle operation, and writing and erasing of a fusion memory in a ferroelectric reversal mode according to the embodiments of the present disclosure.
Figure 8B:
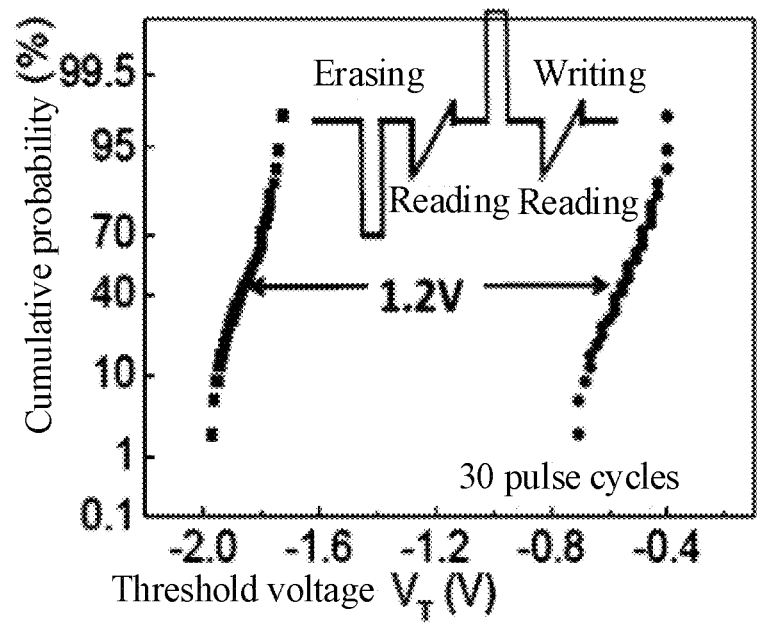
Figure 8C:
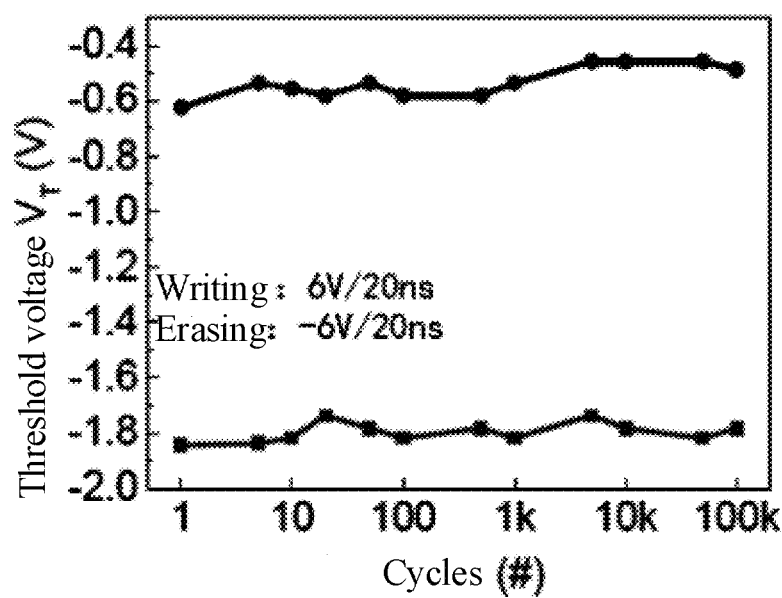

In some embodiments, for the applying of the second voltage, referring to FIGS. 8A to 8C, an electric field is applied to the memory cell (that is, a transistor containing a ferroelectric layer). When the second voltage is applied, the ferroelectric domain is polarization reversed (the second voltage is greater than the reversal voltage). As shown in FIG. 8B, a forward second voltage is set to 6 V and a pulse time is set to 20 ns. During this process, the threshold voltage is changed, that is, data writing is realized, and the ferroelectric domain is polarization reversed at the same time. By comparing with the existing FLASH, as shown in FIG. 8B and FIG. 8C, after many cycles, the threshold voltage is still lower than that of the conventional FLASH, and the retention time and the speed are equivalent to that of the conventional FLASH, and the programming voltage is much smaller than that of the conventional FLASH.

In some embodiments, the writing method further includes reading the data written into the memory cell. For example, as shown in FIG. 7C, a smaller reading voltage (for example, −0.7 V) may be applied to read data. The threshold voltage is not changed at this time.

Figure 6:
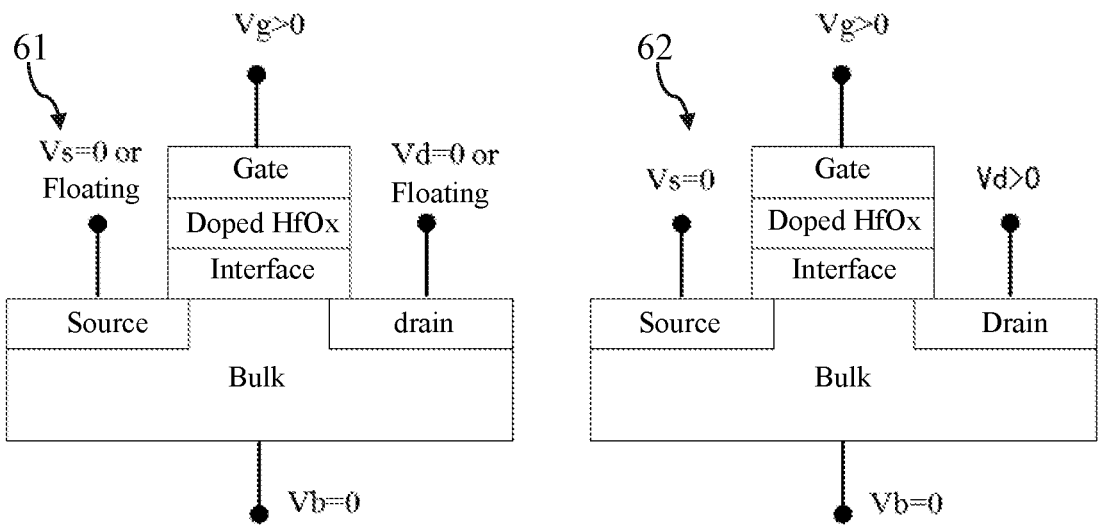
FIG. 6 shows a schematic diagram of an erasing method of a fusion memory according to the embodiments of the present disclosure.

FIG. 6 shows a schematic diagram of an erasing method of a fusion memory according to the embodiments of the present disclosure. As shown by 61 in FIG. 6, each of the source of the memory cell and the drain of the memory cell is maintained at zero potential (such as grounded) or in a floating state, and the bulk substrate is maintained at zero potential (such as in a grounded state). In addition, a negative third voltage is applied to the gate, an absolute value of the third voltage is less than a reversal voltage at which the ferroelectric layer is polarization reversed. The operating state may refer to the charge trap mode in FIG. 4, which is implemented in a low voltage range (which is less than the reversal voltage). By applying the third voltage, the electrons are charged and discharged, and the threshold voltage is changed. The changing process of the threshold voltage is faster, and may reach an erasing speed of 20 ns, which is faster and has a lower voltage than that of the conventional DRAM.

Referring to FIGS. 7A to 7C at the same time, as shown in FIG. 7A, when an electric field is applied to the memory cell (that is, a transistor containing a ferroelectric layer), a central atom in the crystal of the ferroelectric layer is in a low energy state under the electric field. After removing the electric field, the central atom remains in a low energy state. When the third voltage is applied, the ferroelectric domain is not polarization reversed (the third voltage is in a non-reversed voltage range). As shown in FIG. 7B, a forward third voltage is set to −4 V and a pulse time is set to 20 ns. During this process, the threshold voltage is changed, that is, data erasing is realized. By comparing with the existing DRAM, as shown in FIG. 7B and FIG. 7C, after the number of cycles is more than $10^{12}$, the threshold voltage is still less than that of the conventional DRAM, and a retention time is more than 1000 seconds at 85° C. An erasing speed is equivalent to that of DRAM, and retention characteristics are much better than the conventional DRAM.

In some embodiments, the erasing method of the fusion memory may further include an erasing manner 62 as shown in FIG. 6. In the erasing manner 62, a fourth voltage is applied between the gate of at least one memory cell and the bulk substrate of at least one memory cell, and an absolute value of the fourth voltage is greater than the reversal voltage at which the ferroelectric layer is polarization reversed, the bulk substrate is at zero potential (such as in a grounded state), the gate is in a negative voltage state, the drain is grounded or in a floating state, and the source is in a positive voltage state. The operating state may refer to the ferroelectric reversal mode in FIG. 4, which is implemented in a high voltage range (which is greater than the reversal voltage). By applying the fourth voltage, the ferroelectric layer is polarization reversed. An erasing voltage of this process is still less than that of conventional FLASH, and the erasing speed is also faster, and may reach an erasing speed in the magnitude of 20 ns.

In some embodiments, for the applying of the fourth voltage, referring to FIGS. 8A to 8C, an electric field is applied to the memory cell (that is, a transistor containing a ferroelectric layer). When the fourth voltage is applied, the ferroelectric domain is polarization reversed (an absolute value of the fourth voltage is greater than the reversal voltage). As shown in FIG. 8B, a reverse fourth voltage is set to −6 V and a pulse time is set to 20 ns. During this process, the threshold voltage is changed, that is, data erasing is realized, and the ferroelectric domain is polarization reversed at the same time. By comparing with the existing FLASH, as shown in FIG. 8B and FIG. 8C, after many cycles, the threshold voltage is still lower than that of the conventional FLASH, and the retention time and the speed are equivalent to that of the conventional FLASH, and the erasing voltage is much smaller than that of the conventional FLASH.

According to another aspect of the embodiments of the present disclosure, a memory including a plurality of memory cells is provided, and each memory cell of the plurality of memory cells includes a deep-level defect dielectric layer, so that each memory cell may operate in a charge trap mode. Therefore, the memory has the function of DRAM, while an operating voltage is much lower than that of conventional DRAM, and programming speed and erasing speed are fast.

Figure 9A:
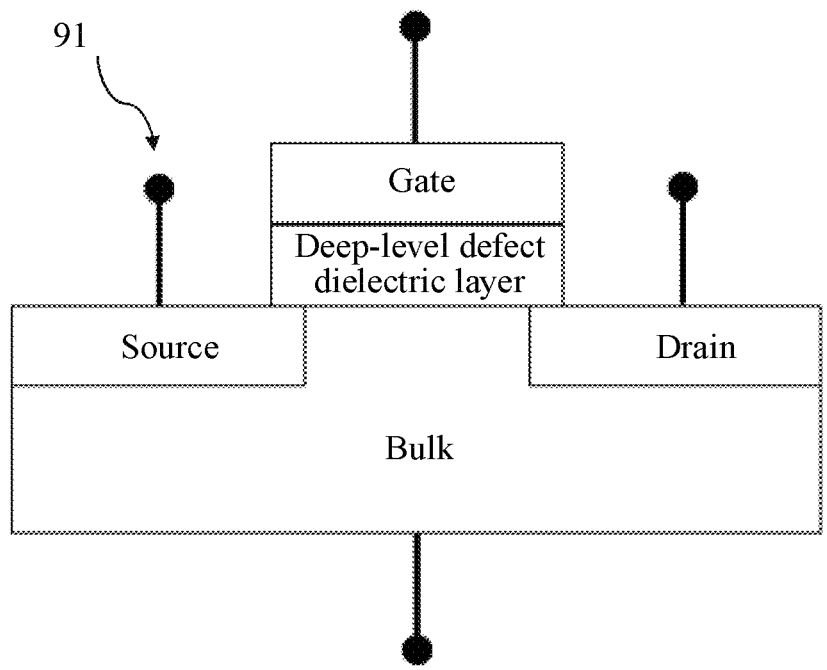
FIGS. 9A to 9C are respectively cross-sectional schematic diagrams of memory cells of three types of memories according to the embodiments of the present disclosure.

FIG. 9A is a cross-sectional schematic diagram of a memory cell in a fusion memory according to the embodiments of the present disclosure. A fusion memory is provided in FIG. 9A, and the fusion memory includes a plurality of memory cells 91, and the memory cell 91 includes: a bulk substrate; a source and a drain on the bulk substrate; a channel extending between the source and the drain; a deep-level defect dielectric layer on the channel; and a gate on the deep-level defect dielectric layer.

The memory cell in this embodiment includes the channel and the deep-level defect dielectric layer on the channel, the channel and the deep-level defect dielectric layer are in direct contact. By adjusting a voltage applied to the gate, the deep-level defect dielectric layer may operate in the charge trap mode and the polarization reversal mode.

The deep-level defect dielectric layer between the gate and the channel shown in FIG. 9A is used as a gate dielectric. The fusion memory may store charges by using a large number of lattice defects in a deep-level defect material, so that the fusion memory may operate in the charge trap mode, and store data by trapping and releasing charges.

The deep-level defect dielectric layer according to the embodiments of the present disclosure refers to include a dielectric layer material with a charge trap energy level of 1 eV or more, such as SiN, ferroelectric materials, and the like.

In some embodiments, the ferroelectric layer may include a material that is doped $HfO_x$, $ZrO_x$, PZT, BFO or BST, preferably $HfO_x$; doping elements may be Si, Zr, Hf, Al, Y, Gd, La, Sr, Ti, and/or N, etc., preferably Zr; and doping content is between 10% and 75%.

In some embodiments, a thickness of the ferroelectric layer is 3 nm to 10 nm; a length of the channel is 5 nm to 200 nm, and a width of the channel is 5 nm to 500 nm.

In some embodiments, the above-mentioned bulk substrate, source, drain, and gate may be configured according to the existing memory cells arrangement, and a corresponding manufacturing process may also be performed with reference to the existing process flow.

In some embodiments, the fusion memory further includes a control circuit, and a gate control sub-circuit connected to each memory cell for separately applying a specific first voltage to the gate, so that the deep-level defect dielectric layer under the gate traps electrons, and the threshold voltage is changed during charging or discharging. The control circuit may also be integrated in a read-write circuit of the fusion memory to control a corresponding voltage pulse value during a read-write process. The read-write circuit writes content into an accessed memory cell at the first voltage or reads out information from the accessed memory cell according to read and write instructions of CPU. An absolute value of the first voltage may be less than a value of a reversal voltage at which the deep-level defect material of the deep-level defect dielectric layer is polarization reversed. As the first voltage increases, the more electrons trapped by the deep-level defect dielectric layer, the threshold voltage of the memory cell will gradually increase.

In some embodiments, according to the requirements of the memory, the source and the drain may be kept in a floating state, or adjusted to a corresponding state (a positive voltage, a negative voltage or grounded) according to an operating state of the memory (writing, erasing, or reading). A specific adjustment method may refer to the above-mentioned embodiments of the writing method of the fusion memory.

In some embodiments, the fusion memory of the embodiments of the present disclosure may use a word line, bit line, and source line known in the related art to configure a memory cell array. The word line is coupled to the gate of the corresponding memory cell, the bit line is coupled to the drain of the corresponding memory cell, and the source line is coupled to the source of the corresponding memory cell.

In some embodiments, the fusion memory of the embodiments of the present disclosure further includes a readout circuit for reading the information stored in each memory cell. By applying a smaller readout voltage (for example −0.7 V, 0 V or 0.7 V), the information stored in the memory cell may be read in the deep-level defect polarization reversal mode or the deep-level defect dielectric layer trap electron mode, respectively.

Figure 9B:
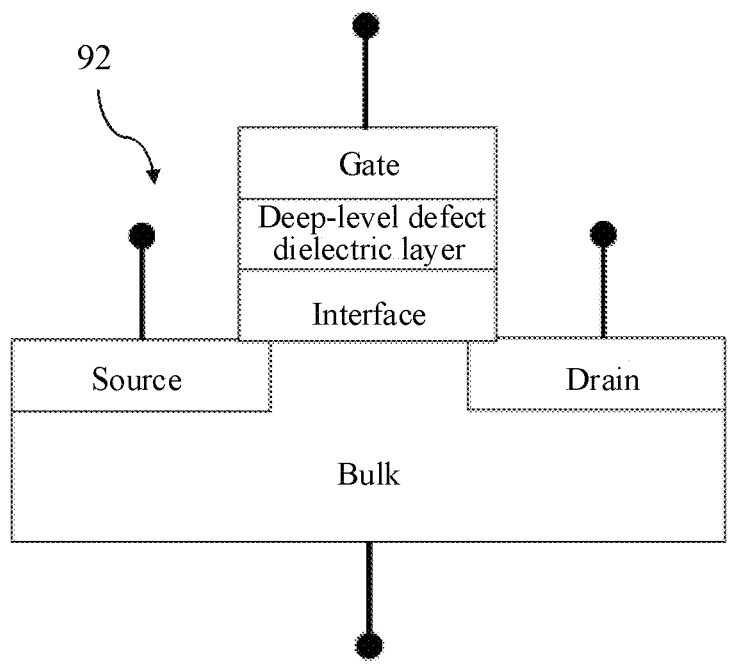

FIG. 9B shows a cross-sectional schematic diagram of a memory cell in another fusion memory according to the embodiments of the present disclosure. FIG. 9B provides a fusion memory, and the fusion memory includes a plurality of memory cells 92, and each memory cell 92 of the plurality of memory cells 92 includes: a bulk substrate; a source and a drain on the bulk substrate; a channel extending between the source and the drain; a first interface layer on the channel; a deep-level defect dielectric layer on the first interface layer; and a gate on the deep-level defect dielectric layer.

A structure of the memory cell in this embodiment is substantially similar to that in FIG. 9A, except that a first interface layer is provided between the deep-level defect dielectric layer and the channel. The first interface layer may be used to control a growth of a deep-level defect material, such as lattice orientation control or defect distribution.

In some embodiments, the first interface layer may include a material that is $SiO_2$, SiN, SiON, $AlO_x$, $TiO_2$, $HfO_x$ or a combination thereof, preferably $SiO_2$. A thickness of the first interface layer may be 0.3 nm to 3 nm. The material of the first interface layer is adjusted according to a deep-level defect material to be grown, for example, when the deep-level defect material is $HfO_x$, a corresponding material of the first interface layer may be SiON; for example, when the deep-level defect material is SBT or PZT, a corresponding material of the first interface layer may be $HfO_x$ or $AlO_x$.

Figure 9C:
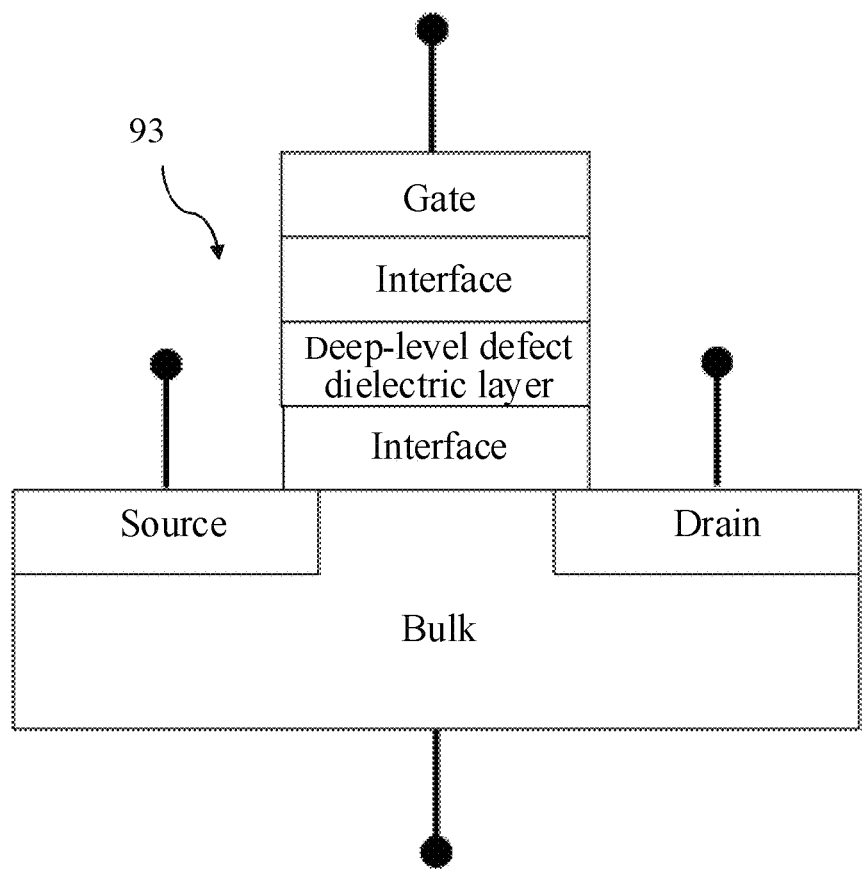

FIG. 9C shows a cross-sectional schematic diagram of a memory cell in another fusion memory according to the embodiments of the present disclosure. FIG. 9C provides a fusion memory, and the fusion memory includes a plurality of memory cells 93, and the memory cell 93 includes: a bulk substrate; a source and a drain on the bulk substrate; a channel extending between the source and the drain; a first interface layer on the channel; a deep-level defect dielectric layer on the first interface layer; a second interface layer on the deep-level defect dielectric layer; and a gate on the second interface layer.

A structure of the memory cell in this embodiment is substantially similar to that in FIG. 9A, except that a first interface layer is provided between the deep-level defect dielectric layer and the channel, and a second interface layer is provided between the deep-level defect dielectric layer and the gate. The first interface layer may be used to control a growth of a deep-level defect material, such as lattice orientation control or defect distribution. The second interface layer is used to isolate the metal gate and a storage layer to avoid mutual diffusion and interface damage.

In some embodiments, the first interface layer may include a material that is $SiO_2$, SiN, SiON, $AlO_x$, $TiO_2$, $HfO_x$ or a combination thereof, preferably $SiO_2$. A thickness of the first interface layer may be 0.3 nm to 3 nm. The material of the first interface layer is adjusted according to a deep-level defect material to be grown, for example, when the deep-level defect material is $HfO_x$, a corresponding material of the first interface layer may be SiON; for example, when the deep-level defect material is SBT or PZT, a corresponding material of the first interface layer may be $HfO_x$ or $AlO_x$.

In some embodiments, the second interface layer may include a material that is $SiO_2$, SiN, SiON, $AlO_x$, $TiO_2$ or $HfO_x$, preferably $AlO_x$. A thickness of the second interface layer may be 1 nm to 10 nm. The material of the second interface layer is adjusted according to a deep-level defect material and a material of the gate. For example, when the deep-level defect material is $HfO_x$, a corresponding material of the second interface layer may be $SiO_2/SiN/SiO_2$ stack. For example, when the deep-level defect material is SBT or PZT, a corresponding material of the second interface layer may be $HfO_x$ or $AlO_x$.

An operating principle of the memory cell in the fusion memory of the above-mentioned embodiments may be referred to the charge trap mode shown in FIG. 4. FIG. 4 shows a schematic diagram of the principle of a fusion memory according to the embodiments of the present disclosure. As shown in FIG. 4, in the charge trap mode, when a gate voltage $V_G$ gradually increases, a threshold voltage $V_T$ also gradually increases. At point A, a scan voltage is −5 V, and a corresponding threshold voltage $V_T$ is about −1.5 V.

When the scan voltage gradually increases and changes to a positive value, such as at point B, the scan voltage is 1 V, and the threshold voltage $V_T$ is about −1.1 V, compared with the case at point A, the threshold voltage at point B is increased, the case is similar to a case at point C and point D, and the fusion memory is also in the charge trap mode.

According to the embodiments of the present disclosure, a neural network computing system is provided, and the system includes: a computing array including a plurality of computing cells, and each computing cell includes: a source, a drain, a gate, and a threshold voltage adjustment layer under the gate; gates of computing cells in each column of the computing array are connected together, and the computing cells in each column is used to determine a weight according to a threshold voltage adjusted by the threshold voltage adjustment layer, and the threshold voltage adjustment layer is a ferroelectric layer.

Figure 10:
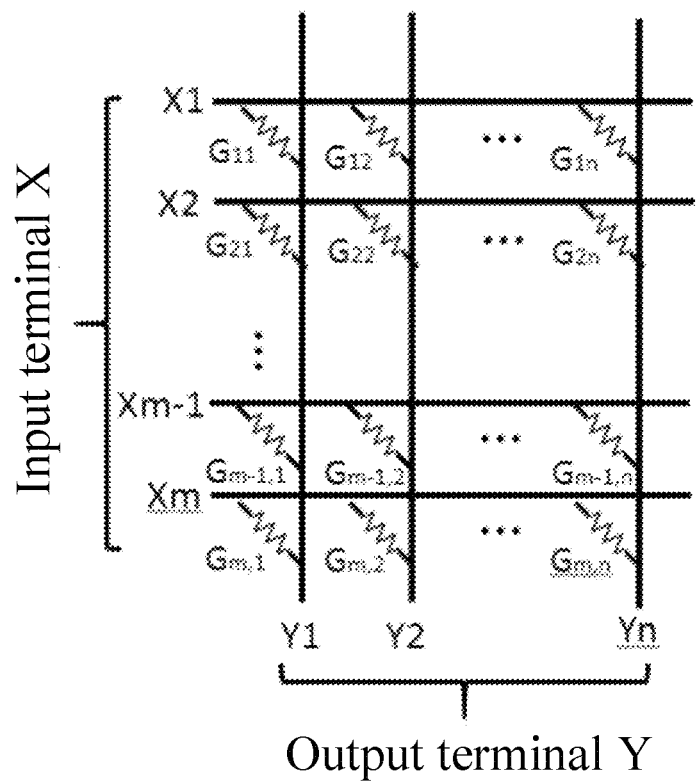
FIG. 10 is a schematic diagram of the principle of a neural network computing apparatus.
Figure 11:
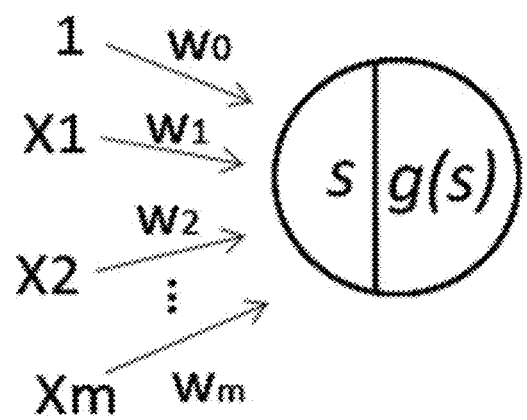
FIG. 11 is a schematic diagram of neuron composition.

First of all, as shown in FIG. 10, in a neural network computing apparatus, in a neural network, conventional synaptic devices are implemented by simulations of two-terminal memristors or three-terminal transistors. The synaptic devices are generally connected to each other by using a parallel NOR structure. After weight training, current convergence is used to complete a calculation. As shown in FIG. 10 and FIG. 11, a current value at an output terminal Y is a sum of voltage values at input terminals X multiplied by the weights (conductance) of respective cross-point synapses.

$$Y = X \times G$$

$$Yn = \sum_m Xm \times Gmn$$

As shown in FIG. 10, a current generated by each terminal is calculated in 10 µA, the maximum parallel number of the input terminal X is about hundreds of magnitudes (the maximum current value at the output terminal Y at the summary is about a few mA). The current generated by each terminal is calculated in 1 µA, the maximum parallel number of the input terminal X is about thousands of magnitudes. This connection manner has problems such as the training power consumption is large and the parallel number is limited. This type of structure has problems such as large operating current and high training power consumption, which limits the parallel number.

Figure 12:
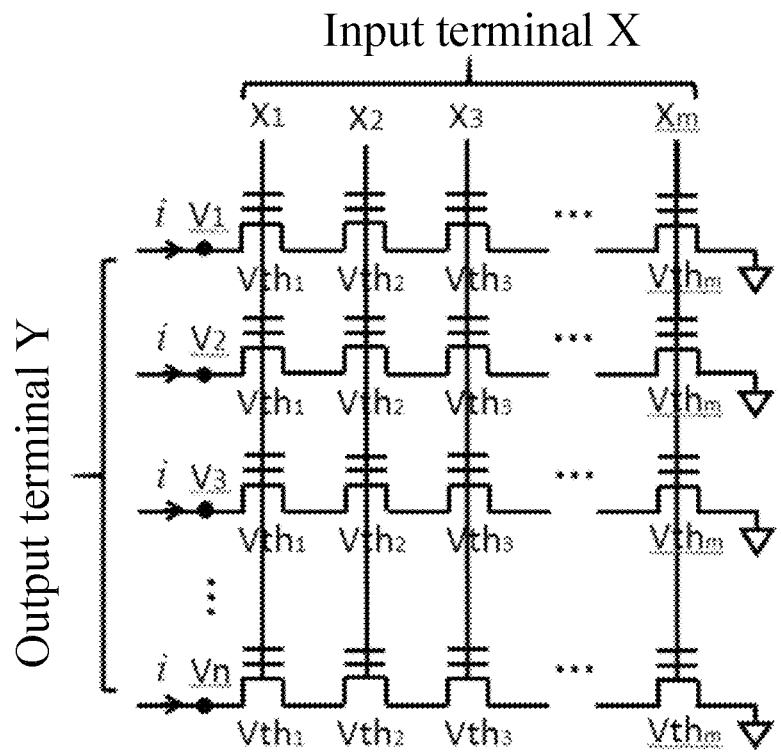
FIG. 12 is a schematic diagram of the principle of a neural network computing system according to the embodiments of the present disclosure.

Based on the above description, as shown in FIG. 12, a neural network computing system provided by the embodiments of the present disclosure includes: a computing array including a plurality of computing cells, and each computing cell includes a threshold voltage adjustment layer, and the threshold voltage adjustment layer is a ferroelectric layer.

Figure 13:
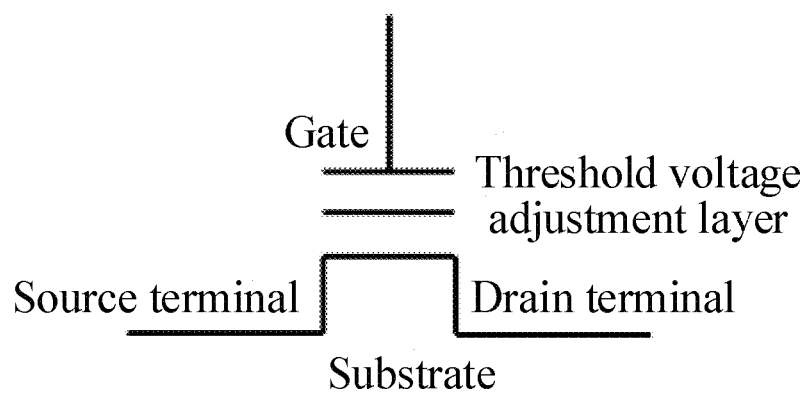
FIG. 13 is a schematic diagram of a memory cell in the neural network computing system in FIG. 12.

As shown in FIG. 13, the computing array including a plurality of computing cells, and each computing cell includes: a source; a drain; a gate; a threshold voltage adjustment layer under the gate; and a channel extending between the source and the drain. The threshold voltage adjustment layer is on the channel. The gates of the computing cells in each column of the computing array are connected together, and the computing cells in each column is used to determine a weight according to a threshold voltage adjusted by the threshold voltage adjustment layer, and the threshold voltage adjustment layer is a ferroelectric layer. FIG. 13 shows a three-terminal threshold-adjusted synaptic device. A threshold voltage is adjusted by the threshold voltage adjustment layer, so that a source and drain resistance may be adjusted and used for synapses in the neural network.

In FIG. 12, the computing cells (the synapses) in each row are connected in series. X is an input terminal, and weight training is realized by applying a voltage to the input terminal X. A current during the weight training is mainly a leakage current at Gate terminal (in the magnitude of pA), and the power consumption is small. Optionally, a threshold voltage of the computing cell in $n^{th}$ row and $m^{th}$ column may be determined by simultaneously applying voltages on the $m^{th}$ column of the input terminal X and the $n^{th}$ row of the array, that is, to jointly adjust the threshold voltage of the computing cell to realize weight input of a specific row and column. After the weight training, by applying a fixed current i on each row, a voltage value $V_n$ is read. The magnitude of $V_n$ is proportional to the sum of synaptic resistance values of each row in series. A current value when this structure is read is a constant value, and the parallel number is not limited, which is conducive to form a super large-scale neural network.

$$V_n = \sum_m i \times R_m = \sum_m \frac{i}{\beta(X_m - Vth_m)}$$

In the above-mentioned formula, $V_n$ indicates a total output voltage of the $n^{th}$ row, i ranges from 1 to m, $R_m$ indicates a current of the $n^{th}$ row and $m^{th}$ column, $\beta$ is a transconductance of a transistor; $X_m$ is an input of the $m^{th}$ column of Gate terminals (corresponding to an input value of the neural network), $Vth_m$ is a threshold voltage of the computing cell in the $m^{th}$ column and the $n^{th}$ row.

In some embodiments, the gates of each column in the computing array is used to input a value to be calculated, and the computing cells of each row in the computing array are connected in series to output an output value obtained by computing of the each row of the computing cells.

In some embodiments, the computing cells in each row are also connected in series with a summation circuit for summing computing results of respective computing cells to form an output voltage value. That is, output values $i \times R_m$ at respective drain terminals in the above-mentioned formula are added to obtain $V_n$.

In some embodiments, the back end of the summation circuit of each row further includes an analog-to-digital conversion circuit for converting an output voltage value of each row into an output value of a corresponding digital signal.

In some embodiments, the ferroelectric layer material is doped $HfO_x$, $ZrO_x$, PZT, BFO or BST.

In some embodiments, the computing cells in the computing array form a 3D stack.

In some embodiments, an absolute value of a voltage applied to the gate of each computing cell is greater than a reversal voltage at which the ferroelectric layer is polarization reversed.

Figure 14:
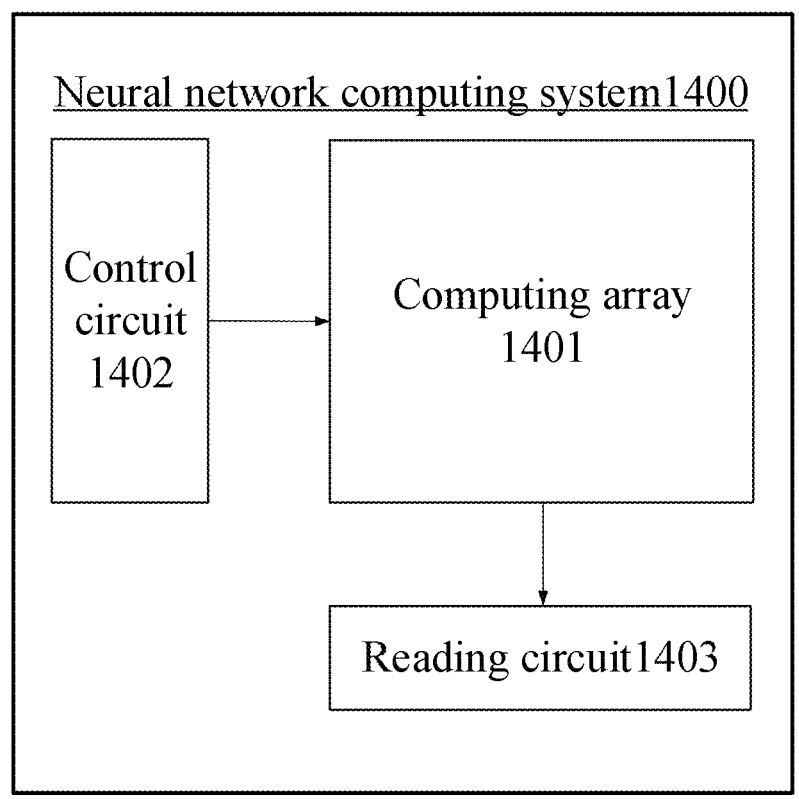
FIG. 14 is a block diagram of a neural network computing system according to the embodiments of the present disclosure.

FIG. 14 is a block diagram of a neural network computing system according to the embodiments of the disclosure. As shown in FIG. 14, a conventional neural network computing system 1400 may include a computing array 1401, a control circuit 1402, and a reading circuit 1403. The control circuit 1402 may control the computing array to input the weights of the computing cells in the computing array and adjust the weight training (by controlling a gate voltage for the column where the computing cell is located and/or a voltage for the row where the computing cell is located), control the neural network computing (by inputting a voltage corresponding to the input value in the neural network at the input terminal X), and control to read the computing results of the neural network computing (by inputting a read current at the source terminal, outputting a total current/voltage at the end of each row in the series, and determining the corresponding value through the summation circuit and the analog-to-digital conversion circuit and outputting the value to the reading circuit 1403).

Although the present disclosure may describe many details, these should not be construed as limiting the scope of the claimed invention, but as a description of the special features of the specific embodiments. The features described in the present disclosure in the context of separate embodiments may also be implemented in combination in a single embodiment. Conversely, various features described in the context of a single embodiment may also be implemented in multiple embodiments individually or in any suitable sub-combination. Furthermore, although the features described above may be described as acting in certain combinations and even as stated in the scope of the initial claims, in some cases one or more features may be deleted from the required combination and the claimed combination may be for sub-combination or sub-combination variation. Similarly, although operations are described in a specific order in the accompanying drawings, this should not be construed as being required to perform such operations in the specific order shown or in a sequential order, or should not be construed as being required to perform all the operations shown to achieve a desired result.

The specific embodiments described above further describe the purpose, technical solutions and beneficial effects of the present disclosure in further detail. It should be understood that the above descriptions are only specific embodiments of the present disclosure and are not intended to limit the present disclosure. Within the spirit and principle of the present disclosure, any modification, equivalent replacement, improvement, etc., shall be included in the protection scope of the present disclosure.

What is claimed is:

1. A writing method of a fusion memory, wherein the fusion memory comprises: a plurality of memory cells, and each of the plurality of memory cells comprises a bulk substrate, a source and a drain on the bulk substrate, a channel region extending between the source and the drain, a first interface layer on the channel region, a ferroelectric layer on the first interface layer, a second interface layer on the ferroelectric layer, and a gate on the second interface layer, wherein the first interface layer is configured to control a growth of a ferroelectric material of the ferroelectric layer, and the second interface layer is configured to isolate the gate and the ferroelectric layer to avoid mutual diffusion and interface damage, the writing method comprising:
applying a first voltage between the gate of at least one memory cell and the bulk of at least one memory cell, wherein the first voltage is less than a reversal voltage at which the ferroelectric layer is polarization reversed, and each of the source and the drain is grounded or in a floating state, so as to enable the fusion memory to achieve a function of a dynamic random access memory, and the writing method further comprising:
applying a second voltage between the gate of at least one memory cell and the bulk of at least one memory cell, wherein the second voltage is greater than the reversal voltage at which the ferroelectric layer is polarization reversed, and the source is in a grounded state, the gate is in a positive voltage state, so as to enable the fusion memory to achieve a function of a flash memory, wherein the first voltage and the second voltage are both positive voltages.

2. The writing method according to claim 1, wherein the first voltage is between 0.5 V and 3 V.

3. The writing method according to claim 1, wherein the second voltage is between 3 V and 10 V.

4. The writing method according to claim 1, wherein the applying a first voltage comprises:

applying a forward first voltage to the gate so that a voltage of the bulk is in a grounded state.

5. The writing method according to claim 1, wherein the applying a second voltage comprises:

applying a forward second voltage to the gate so that a voltage of the bulk is in a grounded state.

6. The writing method according to claim 1, further comprising:

adjusting a threshold voltage of a corresponding memory cell by adjusting the first voltage and/or by changing a lattice defect of the ferroelectric layer.

7. The writing method according to claim 1, further comprising:

adjusting a threshold voltage of a corresponding memory cell by adjusting the second voltage and/or reversing the polarization.

8. The writing method according to claim 1, further comprising:

applying a read voltage, wherein the read voltage is an intermediate value of a threshold voltage adjustment interval.

9. A processing method of a fusion memory, comprising the writing method according to claim 1.

10. An erasing method of a fusion memory, wherein the fusion memory comprises: a plurality of memory cells, each of the plurality of memory cells comprises a bulk substrate, a source and a drain on the bulk substrate, a channel region extending between the source and the drain, a first interface layer on the channel region, a ferroelectric layer on the first interface layer, a second interface layer on the ferroelectric layer, and a gate on the second interface layer, wherein the first interface layer is configured to control a growth of a ferroelectric material of the ferroelectric layer, and the second interface layer is configured to isolate the gate and the ferroelectric layer to avoid mutual diffusion and interface damage, the erasing method comprising:

applying a third voltage between the gate of at least one memory cell and the bulk of at least one memory cell, wherein an absolute value of the third voltage is less than a reversal voltage at which the ferroelectric layer is polarization reversed, and each of the source and the drain is grounded or in a floating state, so as to enable the fusion memory to achieve a function of a dynamic random access memory, and the erasing method further comprising:

applying a fourth voltage between the gate of at least one memory cell and the bulk substrate of at least one memory cell, wherein an absolute value of the fourth voltage is greater than a reversal voltage at which the ferroelectric layer is polarization reversed, and each of the source and the gate is in grounded or in the floating state, so as to enable the fusion memory to achieve a function of a flash memory, wherein the third voltage and the fourth voltage are both negative voltages.

11. The erasing method according to claim 10, wherein the third voltage is between −1 V and −3 V.

12. The erasing method according to claim 10, wherein the fourth voltage is between −3 V and −10 V.

13. The erasing method according to claim 10, wherein the applying a third voltage comprises:

applying a reverse voltage to the gate so that a voltage of the bulk is in a grounded state.

14. The erasing method according to claim 10, wherein the applying a fourth voltage comprises:

applying a reverse voltage to the gate so that a voltage of the bulk is in a grounded state.

15. A processing method of a fusion memory, comprising the erasing method according to claim 10.

\* \* \* \* \*